United States Patent [19]

Oster, Jr.

[11] 4,238,247

[45] * Dec. 9, 1980

[54] STRUCTURE FOR CONVERSION OF SOLAR RADIATION TO ELECTRICITY AND HEAT

[75] Inventor: Eugene A. Oster, Jr., Toledo, Ohio

[73] Assignee: Owens-Illinois, Inc., Toledo, Ohio

[*] Notice: The portion of the term of this patent subsequent to Jan. 22, 1997, has been disclaimed.

[21] Appl. No.: 91,628

[22] Filed: Nov. 5, 1979

Related U.S. Application Data

[63] Continuation of Ser. No. 917,123, Jun. 19, 1978, Pat. No. 4,184,895.

[51] Int. Cl.³ .............................................. H01L 31/04
[52] U.S. Cl. ................... 136/246; 136/247; 136/248; 136/257; 136/259
[58] Field of Search ........ 136/89 FC, 89 CA, 89 CL, 136/89 HY

[56] References Cited

U.S. PATENT DOCUMENTS

| | | | |
|---|---|---|---|
| 4,130,445 | 12/1978 | Blieden | 136/89 PC |
| 4,184,895 | 1/1980 | Oster, Jr. | 136/89 FC |

*Primary Examiner*—Aaron Weisstuch
*Attorney, Agent, or Firm*—Charles S. Lynch; David H. Wilson; Myron E. Click

[57] ABSTRACT

Disclosed is a structure which in one apparatus converts a part of incident solar energy to electrical energy by the use of photocells mounted on a luminescent solar collector of tubular design while another portion of such incident energy is converted to thermal energy.

6 Claims, 9 Drawing Figures

U.S. Patent  Dec. 9, 1980  Sheet 1 of 3  4,238,247
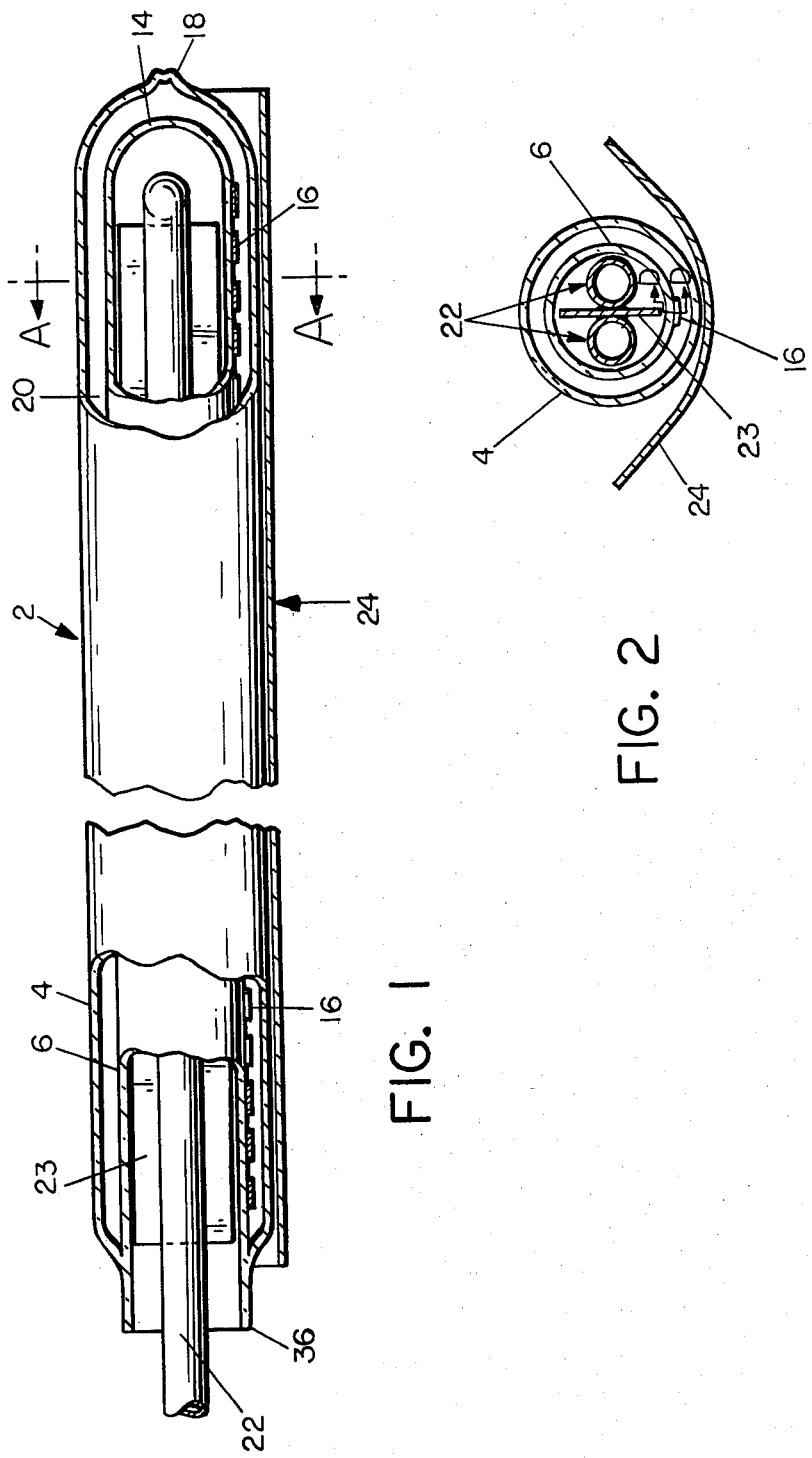

STRUCTURE FOR CONVERSION OF SOLAR RADIATION TO ELECTRICITY AND HEAT

This is a continuation of application Ser. No. 917,123 filed June 19, 1978, U.S. Pat. No. 4,184,895.

This invention concerns apparatus for converting solar radiation to electricity by means of photovoltaic cells. Such cells actually utilize a very small portion of the solar energy incident thereon to produce electricity. Some of the factors leading to this low efficiency include the fact that photocells are not responsive to all the sunlight's wavelengths and also the fact that the presently preferred means to collect and concentrate the sun's rays for delivery to photocells, using luminescent solar collectors to be described hereinafter, normally do not in fact collect or trap about 25 percent of the luminescent radiation created with such collectors for delivery to the photocell.

In view of the foregoing and other factors, I have conceived of a combined apparatus which not only improves some aspects of the state of the art luminescent solar collector-concentrators but which also provides for absorption of light not converted to electricity, and recovery thereof as thermal energy, thus producing both thermal and electrical energy in the same apparatus.

Thus, the present invention concerns the art of exposing semiconductors to sunlight to convert at least a part thereof to electrical energy, but in a setting and an apparatus which results in the conversion to thermal energy of a large portion of the solar radiation not converted to electrical energy.

The usual devices for directly converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive; in consequence, it has been the practice to gather and concentrate the sunlight reaching a given semiconductor photocell so that such extremely large areas of semiconductor material need not be employed as would be necessary without such a gathering system. The common gathering systems in the past were optical systems, wherein lens systems concentrated the light and focused same on a given photocell.

However, such a lens system was and is relatively expensive and is not useful in diffuse light on a cloudy day. More recently, however, there has been conceived a different type of collector and concentrator of radiation to be impinged on a semiconductor photocell. For instance, Weber and Lambe in Applied Optics, Vol. 15, pages 2299-2300, October 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way the light from the sun is not only converted to more suitable wavelengths for activation of the photocell but is concentrated since the light received by the large area of the collector escapes only in the small area where the photocell is optically connected to the collector.

Another article, by Levitt and Weber, appearing in Applied Optics, Vol. 16, No. 10, pages 2684-2689, October 1977, should be read with the article first mentioned.

Other publications aiding in the understanding of the setting of the present invention include Goetzberger, Applied Physics, 14, 123-139, 1977, German patent application No. 2620115 published Nov. 10, 1977 (not published before our conception, however) and, referred to in the latter patent application, German patent application No. 2554226 published June 8, 1977, which is of some peripheral interest.

Also, numerous patents deal with the conversion of solar energy to different wavelengths by means of luminescent or fluorescent layers and impinging emitted light on a photocell; examples are U.S. Pat. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931 benzene and other aromatic hydrocarbons are said to be "fixed" in layers of a silicone resin superimposed on the photocell.

The present invention utilizes luminescent solar collectors and concentrators which are in a general way of the type disclosed in the Goetzberger et al. publication, in German application No. 2620115, in the Weber and Lambe paper and in the Levitt and Weber paper, but of a new design conceived by me.

The structure of the present invention is also in some ways similar to such tubular thermal solar collectors as is disclosed in U.S. Pat. No. 4,043,318 issued Aug. 23, 1977.

U.S. Pat. No. 4,081,289 shows a scheme for cooling solar cells as they generate electricity but in a very different setting than the present invention.

Finally, it should be mentioned that the Goetzberger et al. paper discloses a hybrid thermal-photovoltaic system involving a luminescent solar collector, although of a construction not similar to that of the present invention.

It is an object of the present invention to provide a structure for the simultaneous conversion of solar energy to electricity and to thermal energy.

It is another object of the present invention to provide such a structure including a luminescent solar collector and concentrator having a reduced ratio of edge surfaces to extended radiation collection surface.

Other objects, as well as aspects and advantages, of the invention will become apparent from a study of the accompanying disclosure and the claims.

According to one broad aspect of the invention there is provided a device adapted to produce both electrical energy and thermal energy, from sunlight comprising a radiation collection and concentration medium in the form of a first elongated light conducting tubular member having (a) a continuous, endless wall defining an elongated passage and (b) a first, open end, said medium containing at least one luminescent species capable of emitting luminescent radiation upon excitation with solar radiation, said medium being totally internally reflective of a major portion of said emitted luminescent radiation, means closing the second end of the axial passage of said first member, said first member being curvilinear in any transverse cross-section, a second elongated tubular light conducting outer member having an endless wall that is closed at one end and surrounds said first member, mens joining the endless wall of the outer member and the wall of the first member adjacent said first, open end of the latter, thereby sealing a thermally insulative space between said first member and said outer member, said space being evacuated to a sub-atmospheric pressure, photocell means responsive to said emitted radiation optically coupled to a minor proportion of the exterior surface of said endless wall of said first member and disposed within said subatmospheric space, and means within the elongated passage of said first member for absorbing electromagnetic radiation as thermal energy and for extracting heat from said passage through the open end thereof.

In another aspect of the invention there is provided a method which comprises (1) passing solar radiation into a luminescent solar collector and concentrator means optically coupled to photovoltaic conversion means and converting a portion of the luminescent radiation produced by said luminescent solar collector and concentrator means directly to electricity, said luminescent solar collector and concentrator means surrounding an electromagnetic radiation absorber means for converting electromagnetic radiation to thermal energy, (2) passing another portion of said luminescent radiation and a portion of said solar radiation through said luminescent solar collector and concentrator means into said electromagnetic radiation absorber means and (3) recovering thermal energy by transferring heat to a heat recovery fluid both from (a) said photovoltaic conversion means and (b) said electromagnetic radiation absorber means.

The invention is further described in connection with the description of the drawings, of which FIG. 1 is a side view, partly broken away and in section, of a solar conversion unit of the invention.

FIG. 2 is a sectional view of the apparatus of FIG. 1 taken along the plane A—A.

While in the descriptions that follow the two outermost tubes of FIGS. 1-8 are described as being made of glass, it will be understood that these tubes can also be of plastic, such as poly(methyl methacrylate).

Figure 3:
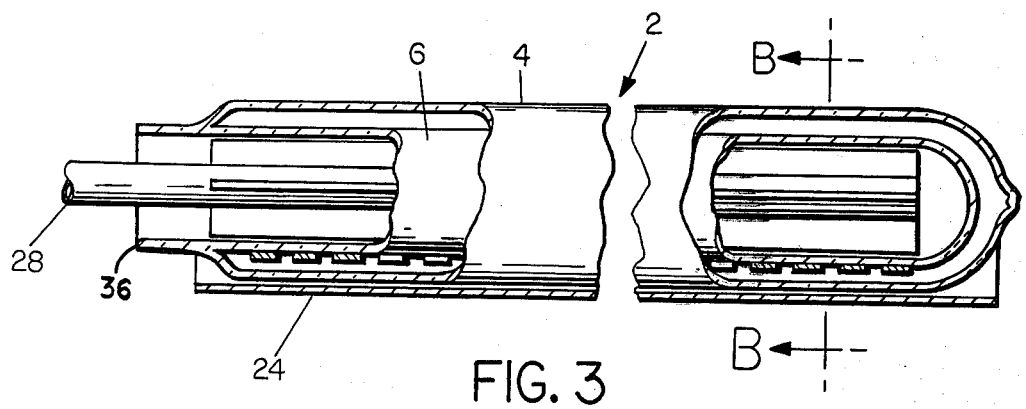
FIG. 3 is a side view, partly broken away and in section, of another version of the solar conversion unit of the apparatus of the invention.
Figure 4:
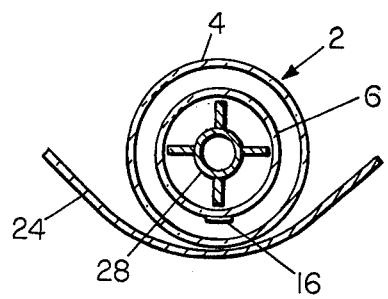
FIG. 4 is a sectional view of FIG. 3 taken along the plane B—B.
Figure 5:
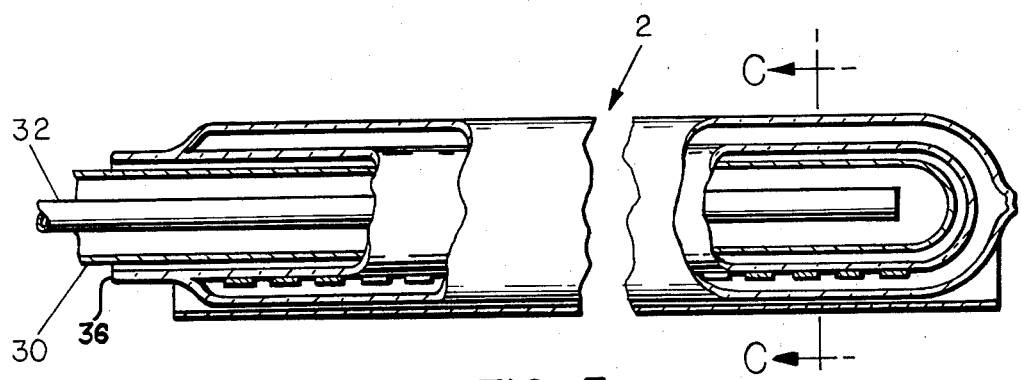
FIG. 5 is a side view, partly broken away and in section, of still another solar conversion unit of the invention.

The assembly 2 of FIGS. 1, 3 and 5 are all the same as far as the structure involving the outer tubes is concerned, and each comprises an outer glass tube 4 that is of convenient length, say from 4 to 7 feet and of a suitable diameter; e.g., of 2.5 inches O. D.

Figure 7:
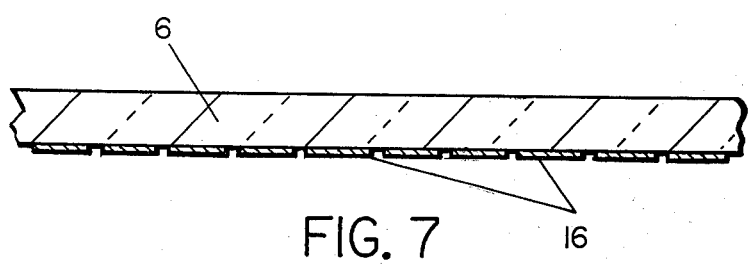
FIG. 7 is a partial sectional view of FIG. 2 taken along the plane D—D.
Figure 8:
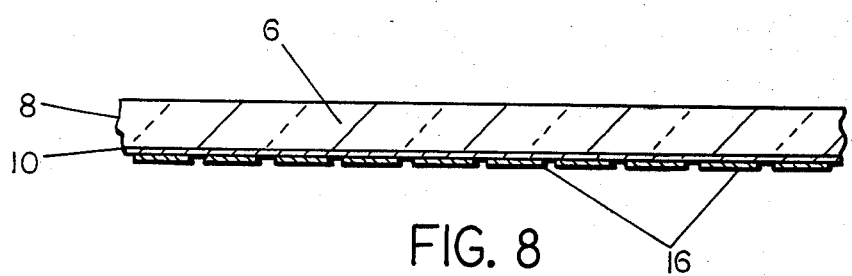
FIG. 8 is a partial sectional view of another version of FIG. 2 taken along the plane D—D of FIG. 2.

The interior tube 6 is made of glass and is of somewhat lesser diameter than tube 4 and of slightly greater length. This tube is the luminescent solar collector and concentrator tube. In a first embodiment it can contain throughout a luminescent species such as $Nd^{III}$ or $Eu^{III}$ oxide as the luminescent species of the collector. Instead of having a luminescent species within the wall of the glass tube 6, or in addition to having a luminescent species within the wall of the glass tube, the tube 6 in a second embodiment is a laminate of glass tube 8 coated along most of the outside of its length with a thin plastic layer 10 containing another (or several) luminescent species, such as a fluorescent dye or a fluorescent metallic chelate and such layer may be of any suitable thickness such as up to about 1 millimeter thick, but is usually much thinner, such as from 1 mil to 0.2 mm. thick. The first embodiment is shown in FIG. 7, wherein tube 6 is a single glass layer. The second embodiment is shown in FIG. 8 wherein tube 6 is a laminate of glass layer 8 and luminescent species containing layer 10. Tube 6 in addition can contain on the substantially hemispherical end surface thereof a highly reflective coating or mirror 14. This mirror coating will prevent leakage of some luminescent radiation which might otherwise occur in this area.

In assembly, there can be inserted support means near the hemispherical end of tube 6 which supports tube 6 only by very small area point contact (in order to minimize luminescent radiation leakage). Then the tube 6, which already contains surface coating 10, if any, and already contains bonded and optically coupled photovoltaic cells 16 arranged in a row along tube 6 in an axial direction, is fastened to outer tube 4 by fusing the open end of tube 4 to the wall of tube 6 near its open end. Thereafter, a vacuum is pulled through the opposite end of tube 4 at a tubulation and sealed off at the tip 18 in the manner known to those skilled in the art, the resultant sealed space 20 between the outer tube 4 and the luminescent solar collector tube 6 being highly evacuated; suitably the vacuum is on the order of $10^{-4}$ torr of vacuum.

The cells 16 can be bonded to the surface of tube 6 with a suitable plastic film. For instance, about a 20 percent solution of poly(methyl methacrylate) and ethylene dichloride can be employed as a bonding medium. In any event, the bonding medium should have an index of refraction close to that of the surface of tube 6.

While in FIGS. 7 and 8 the photocells 16 are shown as having a definite separation, for illustration purposes, it is usually preferred that the cells are placed end to end as close as is practicable. The photocells are suitably silicon semiconductor photovoltaic cells having a P-N junction and on their surface preferably have an antireflection coating in order to minimize reflections of light entering the cell.

All of the foregoing description is equally applicable to FIGS. 1 through 9. In the figures, the same elements have the same numbers.

Figure 9:
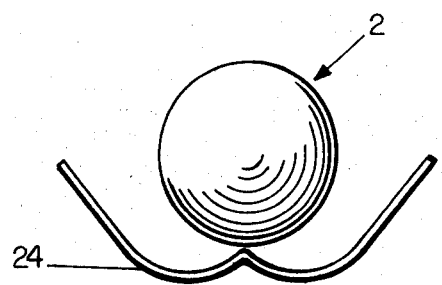
FIG. 9 is an end view of any one of FIGS. 1, 3 and 5 showing an alternate shape of the mirror.

Turning now in further discussion to FIGS. 1 and 2, conduit 22 having a hairpin turn near the closed end of tube 6 has several purposes. First, a fluid such as water can be circulated through the tube for the recovery of heat. The character of the tube overall is such that it absorbs light and converts it largely to heat; furthermore, the tube is such that it has a low infrared emittance, preferably 0.1 or lower. Suitably, the tube is made of smooth, shiny metal tubing overcoated with a black material having a high absorptance for light of 0.8 or greater, such as black chromium oxide, for instance, or black nickel oxide. Desirably, a mirror 24, either of the shape shown in FIG. 2 or of the gull-wing shape shown in FIG. 9 is advantageously disposed so that assembly 2 is between the mirror and the sun. The mirror, of course, causes a greater amount of solar radiation to be incident on luminescent solar collector tube 6 and also serves to reflect back toward collector tube 6 electromagnetic radiation escaping through the walls of tube 6.

It may also be desired to include on the outside of tube 4 and/or on the outside of tube 6 an antireflective coating as the outermost layer in order to minimize reflection on entry of solar radiation into the tubing sidewall.

In operation, sunlight enters the walls of apparatus 2 directly and after reflection from mirror 24, and when it strikes the luminescent species in the walls of tube 6, luminescent radiation of a longer wavelength than that activating the luminescent species on absorption thereby is emitted. A high proportion of the luminescent radiation is trapped by the process of total internal reflection and, as is well known in the art, exemplified by the references discussed herein, the trapped radiation bounces from inner surface to outer surface of tube 6 until it eventually reaches an optically coupled photocell and activates said photocell to produce electricity which is recovered by means of electrical contacts passing through the wall of tube 4, suitably through a region near where tubes 6 and 4 join, which electrical contacts or leads are not shown.

The other portion of the sunlight (unconverted by the luminescent species) and the portion of the luminescent radiation which escapes the wall of 6 inwardly is absorbed by tube 22 and having fins 23, because of the solar selective absorptive coating thereon. Fluid circulating through tube 22 recovers the heat by conduction. Suitably the fluid is water or other high heat capacity liquid, although it can be a gaseous fluid. It should be noted that the space next to the inner wall of tube 6 must contain a low refractive index fluid or gas or a vacuum. Normally the space is simply occupied by air. If the material next to the inner wall of 6 had a high index of refraction, the large proportion of the luminescent radiation otherwise trapped in the walls of 6 would simply not be trapped and would travel through to the fluid, as will be understood by those skilled in the art.

FIGS. 3 and 5 will not be discussed further except as the setting for the inner heat transfer arrangements thereof which are alternates to tube 22 of FIGS. 1 and 2. Thus, in the embodiment of FIGS. 3 and 4, the radiation that passes inwardly to the wall of tube 6 is absorbed by finned tube 28 which is open at both ends. Air or other heat transfer fluid having a low refractive index relative to that of tube 6 is passed into the open end of tube 6 to the closed end thereof and heated air is extracted through tube 28. Tube 28 can be of the same character as described with respect to tube 22; i.e., a metal tube (with fins) having a solar selective absorptive coating with low emittance in the infrared and a high absorptance for sunlight.

Figure 6:
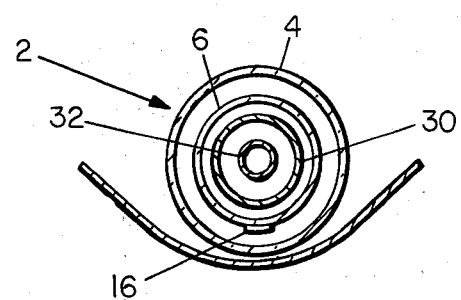
FIG. 6 is a sectional view of FIG. 5 taken along the plane C—C.

In the embodiment of FIGS. 5 and 6 metallic tube 30 having a closed end is contained within the passageway of tube 6 and is spaced apart from tube 6 in order to maintain a low index fluid (or even a vacuum) next to the inner wall of 6. Down the center of tube 30 is open ended tube 32. Tube 30 in combination with tube 32 is an alternate structure to tube 22 of FIGS. 1 and 2, and this arrangement also allows the use of a high refractive index high heat capacity fluid such as water to be used for recovery of heat. Thus, water is passed through the central tube 32 and out the larger tube 30 or vice versa in order to recover the absorbed heat, tube 30 of course being a metal tube having a solar selective coating of the same character as described with respect to the description of tube 22 in FIG. 1.

Now it will be noted from a study of the cited prior art that this prior art utilizing a luminescent collector and concentrator sheet envisions such a sheet as having a flat configuration. Thus, there is a large amount of edge area that has to be silvered for greatest light recovery, except for the edge or edges coupled to photocells. The present structure, in addition to the advantage of recovery of energy from incident light not converted to electricity by converting remaining radiation to heat, has the further advantage that there is only a small area of edge surfaces of the luminescent solar collector to be silvered or to have another reflective coating applied in order to minimize leakage of light concentrated at the edges. Thus, edge 36 in FIGS. 1, 3 and 5 can carry a reflective coating, but the total area of the edge is also so small that it is possible, and perhaps economical, to omit such silvering. In any event, the expensive silvering is relatively small when compared with that necessary with respect to the edge surface of prior art flat plates. Another advantage of the present structure involves the further factor that when a great deal of light is concentrated in solar cells as is the case in the operation of luminescent solar collectors coupled to photocells, the photocells become elevated in temperature, and the present invention allows cooling of the solar cells concomitantly with the recovery of thermal energy from the apparatus. Thus, in the operation of each version of the apparatus depicted in the drawings, heat is transferred from photocells 16 by conduction, or by radiation plus conduction, to the heat transfer fluid. This heat recovered represents further conversion of solar energy to thermal energy.

As noted, the tubes 4 and 6 in FIGS. 1, 3 and 5 can also be made of a low loss, light conducting plastic. For instance, methyl methacrylate can be mixed with the proper amount of a fluorescent dye and a suitable catalyst and the tube made by a centrifugal method employing tubular molds rotated in a liquid bath. See Kirk-Othmer, Encyclopedia of Chemical Technology, Vol. 13, Wiley, New York (1967), page 349 and references cited.

In a specific example a structure according to FIGS. 1 and 2 plus FIG. 8, is made. The tubes 4 and 6 are iron-free borosilicate glass, tube 6 being a composite of borosilicate glass tube 8 and thin layer 10, which latter layer is poly(methy methacrylate) containing a fluorescent dye. The photocells are silicon semiconductors having P-N junctions. Luminescent layer 10 is made by diluting a 40 weight percent solution of poly(methy methacrylate) in an 80:20 weight ratio of toluene to isopropyl alcohol (a commercial product of du Pont tradenamed Elvacite 6014) to an 8 weight percent solution of the polymer in more of the same solvent mixture. This solution is spray coated onto the outside of 2-inch O. D. cylindrical glass tube 8 having a wall thickness of about $\frac{1}{8}$ inch. Before spraying, the polymer solution has added to it 0.15 grams of Coumarin 153 fluorescent dye for each 50 grams of the polymer. Enough coats are sprayed to make a coating 2 mils thick on the outside of the tube. Some of the same polymer solution is painted on the bottom of each of the silicon photovoltaic cells as a cement, and the photocells are then applied in a row to the tube along its length as shown in FIGS. 1 and 8. Borosilicate glass tube 4 having an outside diameter of about 2.5 inches is about 4 feet long, and glass tube 6 is a little longer than that. Suitable electrical connections are applied to connect the cells in series. A tube with a hairpin turn similar to tube 22 in FIGS. 1 and 2, and having a webbed fin 23 along its length is made of steel having a plated bright nickel surface that is overcoated by electroplating with a solar selective coating of black chromium oxide from a chromic acid-acetic acid bath, as set forth in Metal Finishing-Guidebook Directory for 1978, page 196, or any suitable metal tube having a selective solar coating. Thus, the absorptance of the surface over the solar spectrum should be at least about 0.7 and the emittance thereof should be less than about 0.1 over the infrared spectrum, although somewhat higher emittances can be tolerated. In any event, as is well known in the art, such selective solar coatings enable the absorption of most of the solar radiation and conversion thereof to heat. The heating of the tube and the material contained in the tube takes place by thermal conductance and the tube becomes somewhat elevated in temperature. At this elevated temperature the metal tube would be a potential radiator of infrared energy. However, the emittance of the shiny surface is low for infrared so that not much radiant energy is lost, and the thermal energy is recovered by conduction to the circulating heat transfer fluid.

As luminescent materials or species useful in the present invention there can be mentioned by way of example fluorescent chelates, fluorescent dyes and, especially when used in the glass layer of the luminescent collection and concentrator medium, inorganic ions such as $Nd^{III}$ or $Eu^{III}$. Numerous specific dyes are known and available that absorb in different portions of the solar spectrum. These form no part of the present invention. It should also be mentioned that when the thin film luminescent layer embodiment such as is illustrated in FIG. 8 is employed, it is very advantageous and preferred that each luminescent species used has absorption and emission spectra that overlap each other as little as possible, and they preferably do not measurably overlap. Dyes having this characteristic include, for instance, Coumarin 153, Coumarin 6 and Coumarin 151. Coumarin 153 is 1.2.4.5.3H.6H.10H. Tetrahydro-8-trifluoromethyl(1)benzopyrano(9.9a.1-gh)quinolizin-10-one, Coumarin 6 is 3-(2-Benzothiazolyl)-7-N.N-diethylaminocoumarin, and Coumarin 151 is 7-Amino-4-trifluoromethylcoumarin.

Instead of using Coumarin 153 alone in the example of the invention structure given, it can be used together with Coumarin 6. The luminescent emission spectrum of the latter overlaps the absorption spectrum of Coumarin 153, and on exposure to sunlight the Coumarin 6 output activates the Coumarin 153.

Besides the plastic specified in these specific examples for thin luminescent layer 10, other examples of thin luminescent host materials include polystyrene resin, polycarbonate, ethylcellulose, and nitrocellulose. Polystyrene can be dissolved in benzene, polycarbonate in ethylene dichloride and the two cellulose derivatives in acetone.

It should be understood that the "radiation collection and concentration medium" set forth herein and in the claims can be a composite of more than one layer of host materials, in addition to the thick layer of the tube made of glass or plastic as in element 8 shown in FIG. 8. Each such host material can contain a different luminescent species, such as Coumarin 6 in one layer and Coumarin 153 in an adjacent layer.

As will be evident to those skilled in the art, various modifications of this invention can be made or followed in the light of the foregoing disclosure and discussion without departing from the spirit and scope of the disclosure or from the scope of the claims.

I claim:

1. A method which comprises passing solar radiation into the walls of a tubular luminescent solar collector and concentrator means having at least one photovoltaic conversion means optically coupled to the outer surface thereof and converting a portion of the luminescent radiation produced by said luminescent solar collector and concentrator means directly to electricity, and recovering thermal energy by transferring heat by conduction to a heat recovery fluid passed in heat exchange relationship with the interior surface of said tube, which fluid has a low refractive index relative to said tube.

2. A method of claim 2 wherein said fluid is air.

3. A luminescent photovoltaic device comprising a curvilinear tubular luminescent member having a plurality of sides and having one open end and one closed end, at least one photovoltaic means on the outer side of said tubular member, and conduit means in heat exchange relationship with the inner side of said tubular member, said conduit means being adapted to have a cooling fluid passed therethrough to cool said luminescent member.

4. A device according to claim 3 wherein said luminescent member is cylindrical and the center of said cylinder comprises said conduit means.

5. A luminescent photovoltaic device comprising a curvilinear tubular luminescent member having inner and outer walls and having one open end and one closed end, at least one photovoltaic means on the outer wall of said tubular member, and conduit means adapted to flow fluid in heat exchange relationship with the inner wall of said tubular member to cool said tubular member.

6. A device according to claim 5 wherein said tubular member is cylindrical.

* * * * *